(12) United States Patent
Takenaka (10) Patent No.: US 10,361,224 B2
(45) Date of Patent: Jul. 23, 2019

(54) DISPLAY DEVICE

(71) Applicant: Panasonic Liquid Crystal Display Co., Ltd., Hyogo (JP)

(72) Inventor: Yuuichi Takenaka, Hyogo (JP)

(73) Assignee: PANASONIC LIQUID CRYSTAL DISPLAY CO., LTD., Hyogo (JP)

( * ) Notice: Subject to any disclaimer, the term of this patent is extended or adjusted under 35 U.S.C. 154(b) by 100 days.

(21) Appl. No.: 15/284,881

(22) Filed: Oct. 4, 2016

(65) Prior Publication Data

US 2017/0104008 A1 Apr. 13, 2017

(30) Foreign Application Priority Data

Oct. 9, 2015 (JP) ................................ 2015-201546

(51) Int. Cl.
| | |
|---|---|
| H01L 23/00 | (2006.01) |
| H01L 27/32 | (2006.01) |
| G02F 1/1345 | (2006.01) |
| H01L 27/12 | (2006.01) |
| G02F 1/1362 | (2006.01) |

(52) U.S. Cl.
CPC ........ *H01L 27/124* (2013.01); *G02F 1/13452* (2013.01); *G02F 1/136286* (2013.01); *H01L 24/16* (2013.01); *H01L 24/29* (2013.01); *H01L 24/30* (2013.01); *H01L 24/73* (2013.01); *H01L 24/83* (2013.01); *H01L 27/1244* (2013.01); *H01L 27/3276* (2013.01); *H01L 2224/16147* (2013.01); *H01L 2224/29099* (2013.01); *H01L 2224/73203* (2013.01); *H01L 2224/83224* (2013.01); *H01L 2224/83851* (2013.01)

(58) Field of Classification Search
CPC .............. H01L 27/124; H01L 27/1244; H01L 27/3276; H01L 24/29; H01L 24/30; H01L 2224/83851; H01L 2224/83855; H01L 2224/83874; H01L 2224/29198; H01L 2224/83224; G02F 1/13452; G02F 1/136286

See application file for complete search history.

(56) References Cited

U.S. PATENT DOCUMENTS 5,608,559 A * 3/1997 Inada ................... G02F 1/13452
174/251
2015/0319849 A1 11/2015 Shimizu et al.

FOREIGN PATENT DOCUMENTS

WO 2014/092035 6/2014

* cited by examiner

*Primary Examiner* — Zandra V Smith
*Assistant Examiner* — Abbigale A Boyle
(74) *Attorney, Agent, or Firm* — Wenderoth, Lind & Ponack, L.L.P.

(57) ABSTRACT

A display device comprises: a display panel; a metallic wiring formed in the display panel; and a semiconductor integrated circuit element connected to the display panel through a UV curing anisotropy conductive film, wherein the semiconductor integrated circuit element includes a plurality of bumps, the metallic wiring is electrically connected to the bumps through the UV curing anisotropy conductive film, the metallic wiring includes a plurality of openings, and at least one of the bumps is disposed between two adjacent openings closest to each other in the plurality of openings.

8 Claims, 5 Drawing Sheets

DISPLAY DEVICE

CROSS-REFERENCE TO RELATED APPLICATION

This application claims priority from Japanese application JP2015-201546, filed Oct. 9, 2015. This Japanese application is incorporated herein by reference.

TECHNICAL FIELD

The present invention relates to a display device.

BACKGROUND

Conventionally, a wiring of a display device and a terminal (bump) of a semiconductor integrated circuit element are crimped using a thermosetting anisotropy conductive film. However, a deformation of a board due to heat during crimping becomes problematic in the thermosetting anisotropy conductive film. Therefore, there has been used a UV curing anisotropy conductive film having a necessary heating temperature lower than that of the thermosetting anisotropy conductive film.

For example, WO2014/092035A discloses that, when a component such as the semiconductor integrated circuit element is fixed to the board using the UV curing anisotropy conductive film, a UV light transmission opening is formed in a light shielding layer (metallic wiring) of a wiring part such that the UV curing anisotropy conductive film can directly be irradiated with UV light at a place where the UV light is shielded by the wiring part.

SUMMARY

In WO2014/092035A, reliability of connection strength and conductivity is insufficient because the opening is formed in a metallic wiring connected to the bump of the semiconductor integrated circuit element.

An object of the present disclosure is to improve the reliability of the connection between the wiring of the display device and the semiconductor integrated circuit element using the UV curing anisotropy conductive film.

To solve the above problem, a display device according to the present disclosure comprises: a display panel; a metallic wiring formed in the display panel; and a semiconductor integrated circuit element connected to the display panel through a UV curing anisotropy conductive film, wherein the semiconductor integrated circuit element includes a plurality of bumps, the metallic wiring is electrically connected to the bumps through the UV curing anisotropy conductive film, the metallic wiring includes a plurality of openings, and at least one of the bumps is disposed between two adjacent openings closest to each other in the plurality of openings.

In the display device according to the present disclosure, the openings and the bumps may not overlap each other in a plan view.

In the display device according to the present disclosure, the plurality of openings may be formed into a lattice shape at an interval longer than a length in a longitudinal direction of the bump.

In the display device according to the present disclosure, the plurality of openings may be arranged in a zigzag manner.

In the display device according to the present disclosure, each of the plurality of openings may be formed into a square or circular shape.

In the display device according to the present disclosure, at least one of the openings may be located in a region overlapping the semiconductor integrated circuit element in a plan view, and at least one of the openings may be located outside the region overlapping the semiconductor integrated circuit element in a plan view.

In the display device according to the present disclosure, the openings may include a first opening and a second opening that are formed in different layers, and an area of the first opening is larger than an area of the second opening.

In the display device according to the present disclosure, the metallic wiring may include: a narrow wiring part having a width narrower than a UV excitable distance of the UV curing anisotropy conductive film; and a wide wiring part having a width wider than the UV excitable distance of the UV curing anisotropy conductive film, wherein the plurality of openings are not formed in the narrow wiring part, and the plurality of openings are formed in the wide wiring part.

In the configuration of the display device of the present disclosure, the UV transmission opening and the bump do not overlap each other in a plan view. Therefore, the reliability of the connection between wiring of the display device and the semiconductor integrated circuit element can be improved.

DETAILED DESCRIPTION

Hereinafter, exemplary embodiments of the present disclosure will be described with reference to the drawings. In the exemplary embodiments, a liquid crystal display device is described as an example of display device. However the present disclosure is not limited to the liquid crystal display device. For example the present disclosure may be an organic electroluminescence display (OLED) device.

Figure 1:
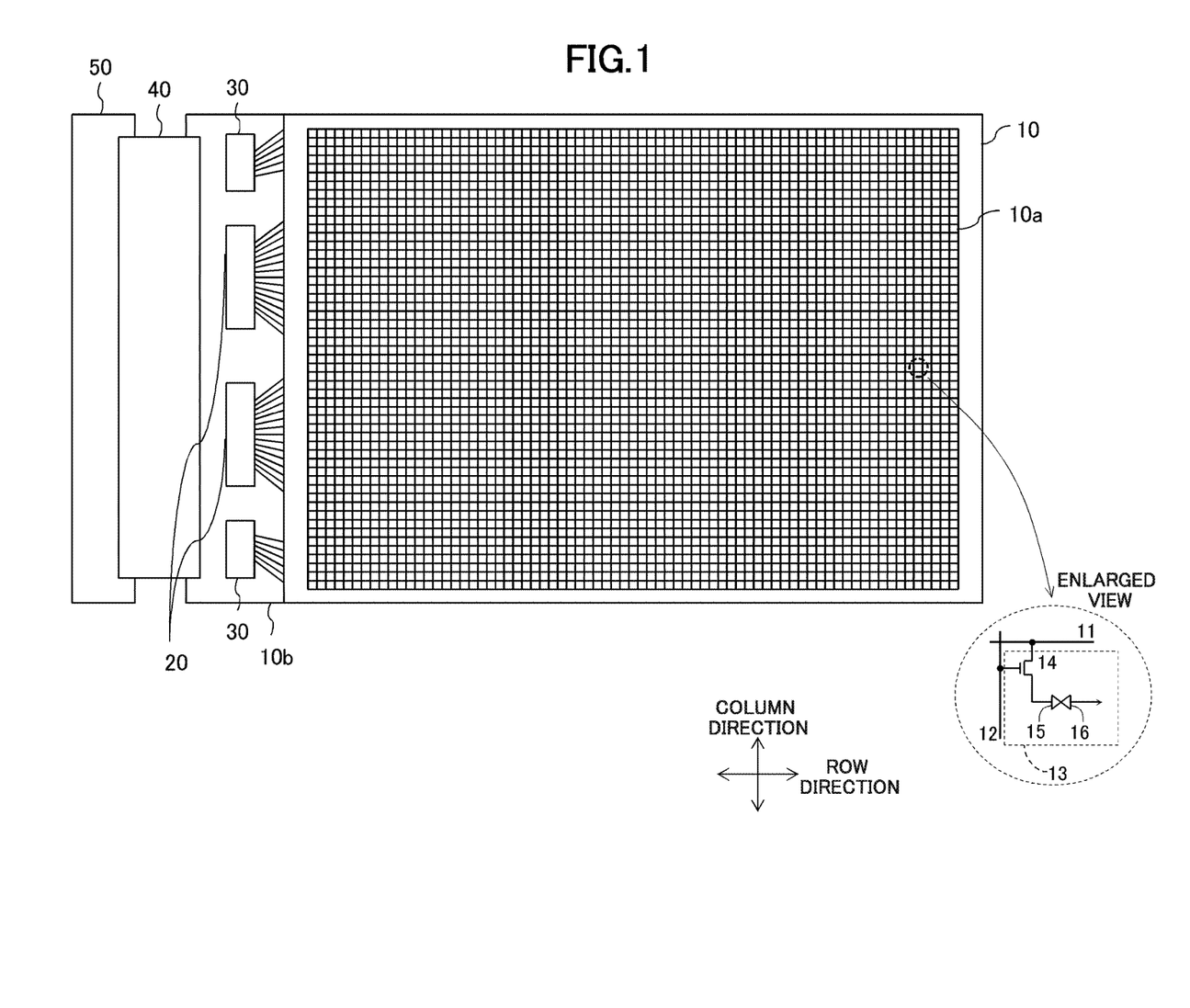
FIG. 1 is a plan view illustrating a schematic configuration of a liquid crystal display device according to an exemplary embodiment.

FIG. 1 is a view illustrating an entire configuration of a liquid crystal display device according to an exemplary embodiment of the present disclosure. The liquid crystal display device includes a display panel 10 that displays an image, a driver IC (data driver IC 20, gate driver IC 30) that is of the semiconductor integrated circuit element that drives the display panel 10, an FPC (flexible printed circuit board) 40, a control circuit board 50 on which a control circuit that controls the driver IC is mounted, and a backlight (not illustrated) that irradiates the display panel 10 with light from a rear surface side. The display panel 10 includes an image display region 10a and a frame region 10b around the image display region 10a.

A plurality of data lines 11 extending in a row direction and a plurality of gate lines 12 extending in a column direction are provided in the image display region 10a. Each data line 11 is electrically connected to the data driver IC 20. Each gate line 12 is electrically connected to the gate driver IC 30. A plurality of pixels 13 are arranged into a matrix shape (in the row and column directions) according to intersection portions of the data lines 11 and the gate lines 12. A thin film transistor 14, a pixel electrode 15, and a common electrode 16 are provided according to each pixel 13. The thin film transistor 14 is provided in each intersection portions of the data line 11 and the gate line 12. It is assumed that the row direction is a direction in which the data line 11 extends, and that the column direction is a direction in which gate line 12 extends.

The driver IC (data driver IC 20, gate driver IC 30), which is of a driving circuit that displays the image in the image display region 10a, is provided in the frame region 10b. A COG system in which the driver IC is directly mounted on a glass substrate of a TFT substrate 100 is adopted in the liquid crystal display device of the exemplary embodiment. The present disclosure may be applied to a TCP system or a COF system.

The driver IC includes the plurality of data driver ICs 20 that drive the data lines 11 and the plurality of gate driver ICs 30 that drive the gate lines 12. In FIG. 1, the data driver ICs 20 and the gate driver ICs 30 are arranged in line in the column direction on one side edge (the side of a left side edge) of the liquid crystal display device. However, the present disclosure is not limited to the configuration in FIG. 1. For example, the data driver ICs 20 may be arranged in the column direction on the side of the left side edge of the liquid crystal display device, and the gate driver ICs 30 may be arranged in the row direction on the side of a top side edge of the liquid crystal display device.

The control circuit board 50 is electrically connected to the display panel 10 through the FPC 40. For example, a timing controller that controls operations of the data driver IC 20 and gate driver IC 30 is mounted on the control circuit board 50.

A CF substrate 200 is provided on a display surface side while facing the TFT substrate 100, and a liquid crystal layer is sandwiched between the TFT substrate 100 and the CF substrate 200. The backlight (not illustrated) that irradiates a liquid crystal panel (display panel) with the light is provided on the rear surface side of the TFT substrate 100.

A liquid crystal display device driving method will briefly be described below. A data signal (data voltage) is supplied to each data line 11 from the corresponding data driver IC 20. A gate signal (gate voltage) is supplied to each gate line 12 from the corresponding gate driver IC 30. A common voltage Vcom is supplied to the common electrode 16 through a common wiring. When an on voltage (gate-on voltage) of the gate signal is supplied to the gate line 12, the thin film transistor 14 connected to the gate line 12 is turned on to supply the data voltage to the pixel electrode 15 through the data line 11 connected to the thin film transistor 14. An electric field is generated by a difference between the data voltage supplied to the pixel electrode 15 and the common voltage Vcom supplied to the common electrode 16. The liquid crystal is driven by the electric field to control transmittance of the light transmitted from the backlight, thereby displaying the image. The desired data voltages are applied to data lines 11 connected to the pixel electrodes 15 of the pixels 13, which are formed by striped color filters to correspond to red, green, and blue, thereby performing color display. The common electrode 16 may be formed in the TFT substrate 100 or the CF substrate 200. The liquid crystal display device driving method is described above by way of example. Alternatively, another known method can be adopted.

Figure 2:
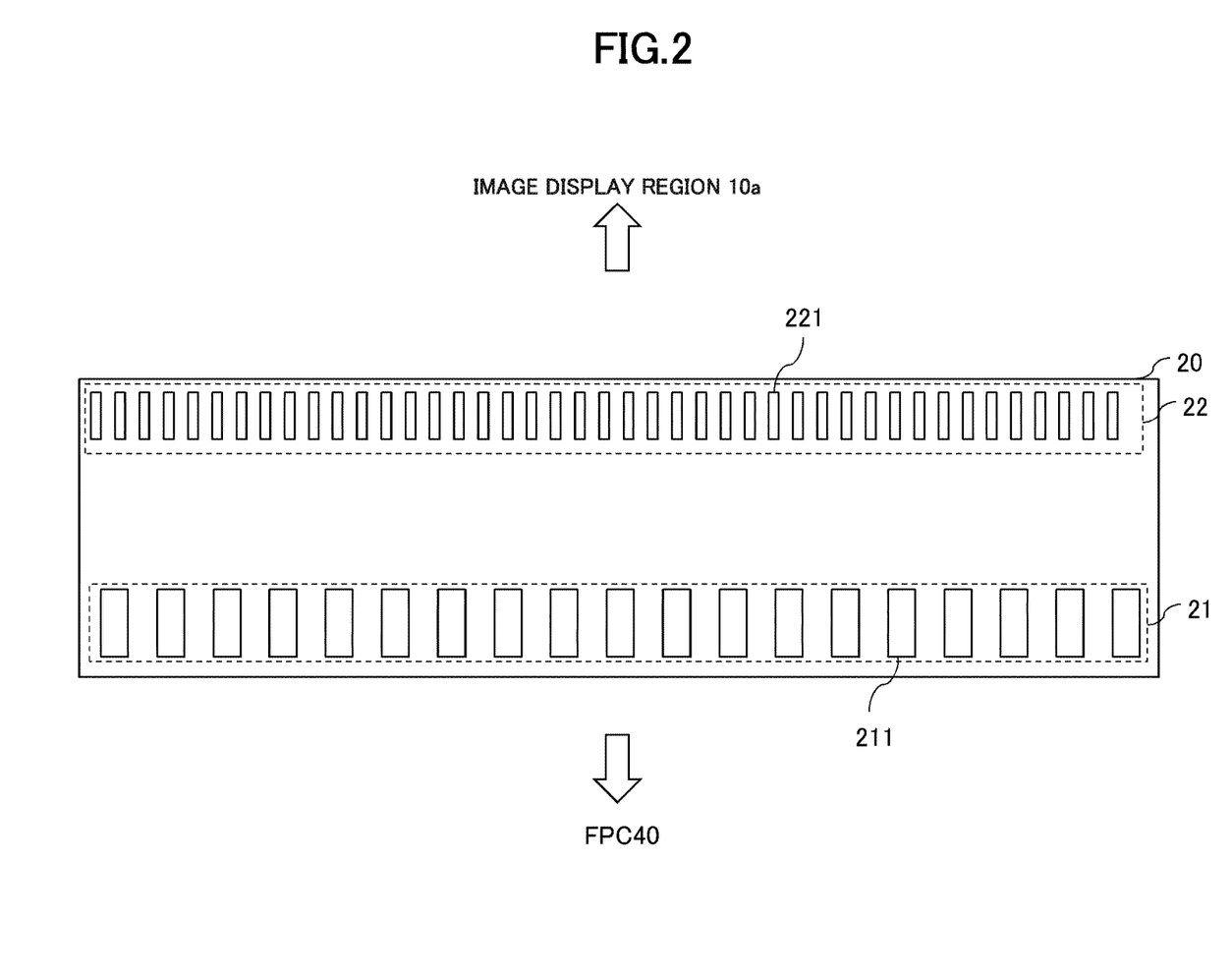
FIG. 2 is a plan view illustrating a configuration of a data driver IC.

FIG. 2 is a plan view illustrating a configuration of the data driver IC 20. In the exemplary embodiment, the data driver IC 20 is described by way of example. The gate driver IC30 also has the similar configuration. FIG. 2 is a view illustrating the data driver IC 20 when the data driver IC 20 is viewed from a back side. The data driver IC 20 includes an input terminal 21 and an output terminal 22. The input terminal 21 includes a plurality of input bumps 211. The plurality of input bumps 211 are arrayed along one side of the data driver IC 20, and electrically connected to the FPC 40 through a connection wiring 61 (to be described later). The output terminal 22 includes a plurality of output bumps 221. The plurality of output bumps 221 are arrayed along one edge of the data driver IC 20, and electrically connected to the data line 11 through a connection wiring 63 (to be described later). A space between the plurality of output bumps 221 is narrower than that between the plurality of input bumps 211. A surface area of the output bump 221 is smaller than that of the input bump 211. In FIG. 2, the shape of the output bump 221 is different from that of the input bump 211. Alternatively, the shape of the output bump 221 may be identical to that of the input bump 211.

Figure 3:
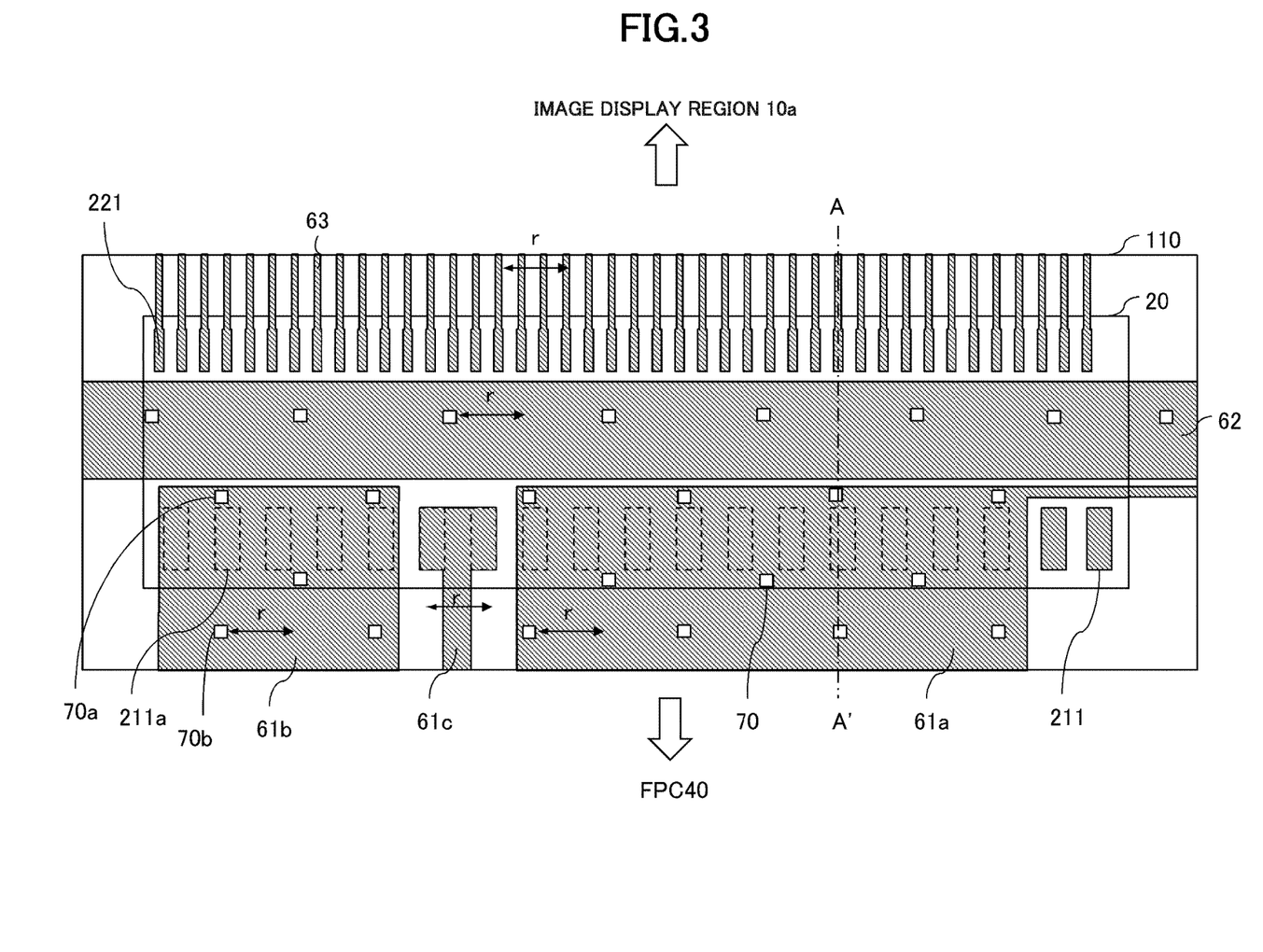
FIG. 3 is a plan view illustrating a configuration of a data driver IC.
Figure 4:
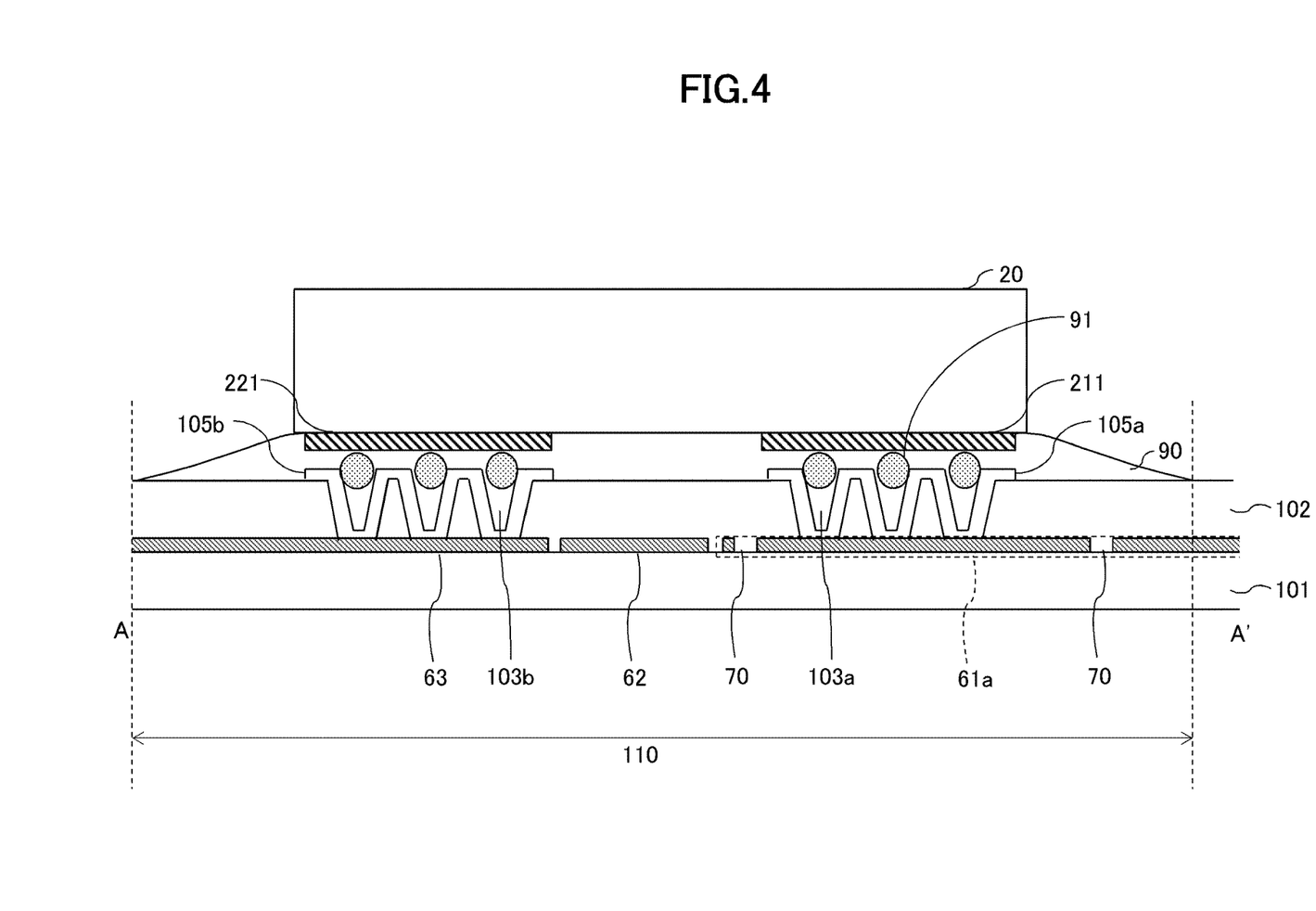
FIG. 4 is a cross-sectional view taken along a line A-A' in FIG. 3.

FIG. 3 is a plan view illustrating a configuration of the data driver IC 20. FIG. 4 is a sectional view taken on a line A-A' in FIG. 3. FIGS. 3 and 4 illustrate the configuration of the data driver IC 20 in a state in which the data driver IC 20 is mounted on the TFT substrate 100.

As illustrated in FIG. 3, a plurality of connection wirings 61 are electrically connected to the plurality of input bumps 211, and the connection wiring 61 is electrically connected to the FPC 40 out of a mounting region of the data driver IC 20. Specifically, as illustrated in FIG. 3, ten consecutive input bumps 211 (the third to twelfth input bumps 211 from the right in FIG. 3) are electrically connected to one connection wiring 61a. Five consecutive input bumps 211 (first to fifth input bumps 211 from the left in FIG. 3) are electrically connected to one connection wiring 61b. Two input bumps 211 (sixth and seventh input bumps 211 from the left in FIG. 3) are electrically connected to one connection wiring 61c. The number of input bumps 211 commonly connected to one connection wiring 61 is not limited to the example in FIG. 3.

Each of the plurality of output bumps 221 is electrically connected to the connection wiring 63, and the connection wiring 63 is electrically connected to the data line 11 out of the mounting region of the data driver IC 20. Each connection wiring 63 is electrically connected to corresponding one data line 11. Each connection wiring 63 and data line 11 may directly be connected to each other in the same layer, or connected to each other in different layers through a contact hole using ITO or a metallic layer.

A connection wiring 62 may be the wiring used in the data driver IC 20, or a wiring used in another application. The connection wiring 62 is not electrically connected to the connection wirings 61 and 63. The connection wiring 62 may be formed in the same layer as the connection wirings 61 and 63, or formed in different layers.

A connection structure of the data driver IC 20 will be described below. As illustrated in FIG. 4, in the TFT substrate 100, the connection wirings 61, 62, 63 are formed on a glass substrate 101. It is assumed that the connection wirings 61, 62, 63 are metallic wirings. An insulator 102 is formed so as to cover connection wirings 61, 62, 63. Below the data driver IC 20, namely, in the region where data driver IC 20 is superposed on the TFT substrate 100 in a plan view, a contact hole 103 (contact hole 103a, 103b) is formed in the insulator 102, and a transparent electrode 105 (transparent electrodes 105a, 105b) is formed in the contact hole 103.

A plurality of transparent electrodes 105a are formed according to the plurality of input bumps 211. Each transparent electrode 105a is formed at the position facing the corresponding input bump 211 when mounting the data driver IC 20 on the TFT substrate 100. Some of conductive particles 91 included in an anisotropy conductive film 90 contact with the transparent electrode 105a, and the input bump 211 of the data driver IC 20 contacts with the remaining conductive particles 91. Therefore, the connection wiring 61 and the input terminal 21 of the data driver IC 20 are electrically connected to each other.

A plurality of transparent electrodes 105b are formed according to the plurality of output bumps 221. Each transparent electrode 105b is formed at the position facing the corresponding output bump 221 in mounting the data driver IC 20 on the TFT substrate 100. Some of conductive particles 91 included in the anisotropy conductive film 90 contact with the transparent electrode 105b, and the output bump 221 of the data driver IC 20 contacts with the remaining conductive particles 91. Therefore, the connection wiring 63 and the output terminal 22 of the data driver IC 20 are electrically connected to each other. The connection wiring 63 extends onto the side of the image display region 10a, and is electrically connected to the data line 11 out of the mounting region of data driver IC 20.

In the anisotropy conductive film 90, the conductive particles 91 are dispersed in an electrically insulating adhesive. In the exemplary embodiment, a UV excitation thermosetting type anisotropy conductive film is used as the anisotropy conductive film 90. The anisotropy conductive film 90 is disposed between the transparent electrode 105a and the input bump 211, and the anisotropy conductive film 90 is irradiated with UV light from the side of the glass substrate 101, thereby curing the anisotropy conductive film 90. Therefore, the transparent electrode 105a and the input bump 211 are connected to each other. The anisotropy conductive film 90 is disposed between the transparent electrode 105b and the output bump 221, and the anisotropy conductive film 90 is irradiated with the UV light from the side of the glass substrate 101, thereby connecting the transparent electrode 105b and the output bump 221 to each other. Thus, the data driver IC 20 and the TFT substrate 100 are connected to each other through the anisotropy conductive film 90. The use of the UV excitation thermosetting type anisotropy conductive film 90 can connect the data driver IC 20 to the TFT substrate 100 at a relatively low temperature.

At this point, because the UV light is not transmitted through the metallic wiring such as the connection wirings 61, 62, 63, the anisotropy conductive film 90 located at the position overlapping the metallic wiring in a plan view is not easily cured. Therefore, in the exemplary embodiment, a plurality of openings 70 are provided, for example, to irradiate the connection wiring 61 and connection wiring 62 with the UV light.

A specific configuration of the opening 70 will be described below. A distance (hereinafter, referred to as a UV excitable distance r) excitable from a UV irradiation position is decided according to the anisotropy conductive film 90. For example, letting UV excitable distance r=100 μm may decide a UV excitable range for one opening 70 as a circular region having a radius of 100 μm centered at a UV irradiation position (opening 70). Preferably the opening 70 is formed such that the anisotropy conductive film 90 is excitable with the UV light in the whole region where the anisotropy conductive film 90 is disposed. In the exemplary embodiment, the region (hereinafter, referred to as a UV irradiation target region 110) where the anisotropy conductive film 90 is disposed is larger than or equal to an external shape of the data driver IC 20 in planar shape (see FIG. 3). Specifically, it is assumed that the UV irradiation target region 110 is a region where the anisotropy conductive film 90 spreads from an outer periphery of the data driver IC 20.

The openings 70 are formed in the metallic wiring in the UV irradiation target region 110. The metallic wiring in the UV irradiation target region 110 includes a narrow wiring part having a width narrower than the excitable distance r and a wide wiring part having a width wider than the UV excitable distance r. Specifically, as illustrated in FIG. 3, the connection wiring 61a, the connection wiring 61b, and the connection wiring 62 are the wide wiring part having the width wider than the UV excitable distance r, and the openings 70 are formed in the connection wiring 61a, the connection wiring 61b, and the connection wiring 62. At this point, the width of the wiring is a width (width in a crosswise direction in FIG. 3) of a bump array direction. The connection wiring 61c and the connection wiring 63 are the narrow wiring part having the width narrower than the UV excitable distance r, and the opening 70 is not formed in the connection wiring 61c and the connection wiring 63. That is, the opening is not formed in the narrow wiring part having the width narrower than the UV excitable distance r, but the opening 70 is formed in the wide wiring part having the width wider than the UV excitable distance r.

At least one bump is disposed between two adjacent openings closest to each other in the plurality of openings 70. As illustrated in FIG. 3, for example, the input bump 211a is disposed between adjacent openings 70a and 70b closest to each other in a longitudinal direction (lengthwise direction in FIG. 3) of the input bump 211a. That is, the plurality of openings 70 are formed at the positions that do not overlap the plurality of input bumps 211 and the plurality of output bumps 221 in a plan view. In this embodiment, the openings 70a is located in a region overlapping the data driver IC 20 in a plan view, and the openings 70b is located outside the region overlapping the data driver IC 20 in a plan view. The input terminal 21 and the output terminal 22 may be disposed between two adjacent openings closest to each other in the plurality of openings 70. The plurality of openings 70 may be formed at the positions that do not overlap the input terminal 21 and the output terminal 22. Therefore, degradation of conductivity and degradation of connection strength can be prevented in the electric connection between the connection wiring 63 and the output terminal 22 of the data driver IC 20 and the electric connection between the connection wiring 61 and the input terminal 21 of the data driver IC 20.

Preferably each of the plurality of openings 70 is formed into a substantially identical square or circular shape. Therefore, it is not necessary to change an orientation of the opening 70 according to the disposition place of the opening 70.

The plurality of openings 70 are formed at the positions that do not overlap the plurality of input bumps 211 and the plurality of output bumps 221 in a plan view, and arranged into a lattice shape at intervals longer than a length in the longitudinal direction of the input bump 211. Specifically, it is only necessary to arrange the openings 70 such that the input bump 211 is sandwiched therebetween in the longitudinal direction (the lengthwise direction in FIG. 3) of the input bump 211. Therefore, the plurality of openings 70 can be arranged at equal intervals within a range where the plurality of openings 70 do not overlap the plurality of input bumps 211 and the plurality of output bumps 221.

The plurality of openings 70 are formed at the positions that do not overlap the plurality of input bumps 211 and the plurality of output bumps 221 in a plan view, and arranged into the lattice shape at intervals shorter than the length in the UV excitable distance r. For example, in the case that the UV excitable range is the circular region having a radius r centered at the UV irradiation position, and the plurality of openings 70 are arranged into the lattice shape at intervals shorter than 2r. Therefore, the formation of the region where UV excitation is not performed can be reduced in the UV irradiation target region 110.

As illustrated in FIG. 3, the plurality of openings 70 are arranged in the zigzag manner at intervals at which the UV excitation can be performed in the whole UV irradiation target region 110. For example, the plurality of openings 70 may be arranged in the zigzag manner while the interval between the openings 70 arranged in the zigzag manner deviates only by a half. Specifically, the interval between the openings 70 in the lengthwise direction in FIG. 3 is set longer than the length in the longitudinal direction of the input bump 211, and set shorter than the UV excitable distance r. The openings 70 are arranged such that the input bump 211 is sandwiched therebetween in the lengthwise direction of FIG. 3. The interval between the openings 70 in the crosswise direction of FIG. 3 is set to a half of the interval between the openings 70 in the lengthwise direction. Therefore, the number of openings 70 decreases compared to the case that the plurality of openings 70 are arranged in the zigzag manner, so that a wiring resistance can be kept low.

Figure 5:
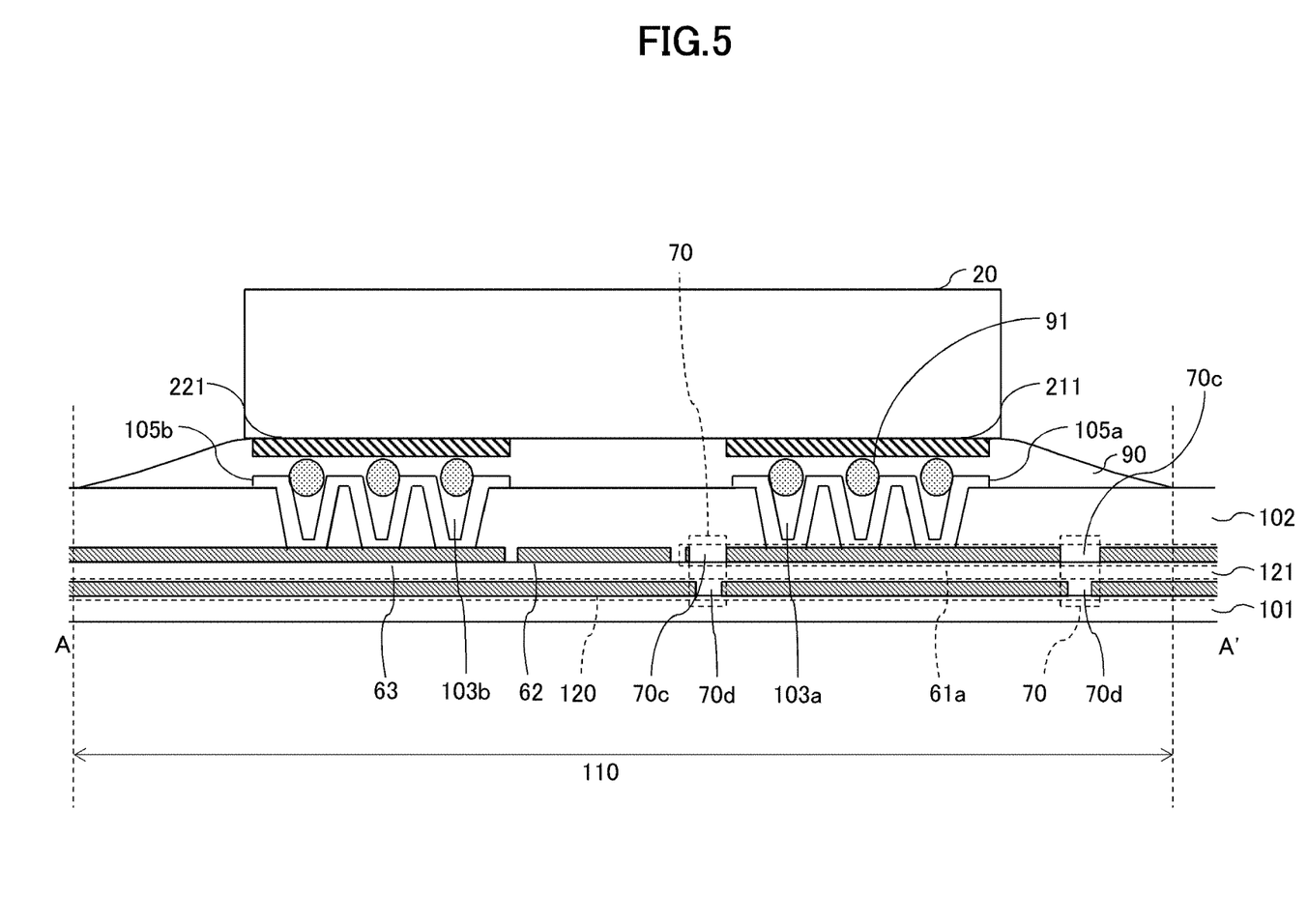
FIG. 5 is a cross-sectional view taken along a line A-A' in FIG. 3.

An example in which the metallic wiring is formed in a plurality of different layers in the TFT substrate 100 will be described below with reference to FIG. 5. FIG. 5 is a sectional view taken on a line A-A' in FIG. 3. FIG. 5 illustrates the configuration of the data driver IC 20 in the state in which the data driver IC 20 is mounted on the TFT substrate 100. The data driver IC 20 in FIG. 5 differs from the data driver IC 20 in FIG. 4 only in the configuration of a metallic layer 120. Accordingly, the configuration equivalent to that in FIG. 4 is designated by the same symbol, and the overlapping description is omitted.

As illustrated in FIG. 5, in the TFT substrate 100, the metallic layer 120 is formed on the glass substrate 101. An insulator 121 is formed so as to cover the metallic layer 120. The connection wirings 61, 62, 63 are formed on the insulator 121. An insulator 102 is formed so as to cover connection wirings 61, 62, 63. Below the data driver IC 20, namely, in the region where data driver IC 20 is superposed on the TFT substrate 100 in a plan view, a contact hole 103 (contact hole 103a, 103b) is formed in the insulator 102, and a transparent electrode 105 (transparent electrodes 105a, 105b) is formed in the contact hole 103.

In the case that the metallic wiring is formed in the plurality of different layers, each opening 70 includes a first opening 70c and a second opening 70d. At this point, in the TFT substrate 100, it is assumed that the second opening 70d is an opening formed in the layer on the side of the glass substrate 101, and that the first opening 70c is an opening formed in the layer on the side of the data driver IC 20. Specifically, as illustrated in FIG. 5, the first opening 70c is formed in the connection wiring 61a and the second opening 70d is formed in the metallic layer 120.

An area of the first opening 70c is larger than that of the second opening 70d. Specifically, at first, the second opening 70d is formed according to a desired size. Then, the first opening 70c is formed larger than the second opening 70d according to a deviation tolerance in forming a pattern. Therefore, the opening having the desired size can be formed even if misregistration occurs between the first opening 70c and the second opening 70d. The first opening 70c and the second opening 70d may be formed with the same size, or the second opening 70d may be formed larger than the first opening 70c. In the case that the second opening 70d is formed larger than the first opening 70c, the first opening 70c may be formed according to the desired size.

In the above, the specific embodiments of the present application have been described, but the present application is not limited to the above-mentioned embodiments, and various modifications may be made as appropriate without departing from the spirit of the present application.

What is claimed is:

1. A display device comprising:
   a display panel;
   a metallic wiring formed in the display panel; and
   a semiconductor integrated circuit element connected to the display panel through a UV curing anisotropy conductive film,
   wherein the semiconductor integrated circuit element includes a plurality of bumps,
   the metallic wiring is electrically connected to the bumps through the UV curing anisotropy conductive film,
   the metallic wiring includes a plurality of openings,
   at least one of the bumps is disposed between two adjacent openings closest to each other in the plurality of openings,
   each of the bumps does not overlap with any opening among the plurality of openings in a plan view,
   the display device further comprises a metallic layer disposed further away from the semiconductor integrated circuit than the metallic wiring,
   the plurality of openings included in the metallic wiring is a first plurality of openings,
   the metallic layer includes a second plurality of openings,
   at least one of the openings of the first plurality of openings overlaps a corresponding one of the openings of the second plurality of openings, and
   an area of the at least one of the openings of the first plurality of openings is larger than an area of the corresponding one of the openings of the second plurality of openings.

2. The display device according to claim 1, wherein the plurality of openings are formed into a lattice shape at an interval longer than a length in a longitudinal direction of the bump.

3. The display device according to claim 1, wherein the plurality of openings are arranged in a zigzag manner.

4. The display device according to claim 1, wherein each of the plurality of openings is formed into a square or circular shape.

5. The display device according to claim 1, wherein at least one of the openings is located in a region overlapping the semiconductor integrated circuit element in a plan view, and
   at least one of the openings is located outside the region overlapping the semiconductor integrated circuit element in a plan view.

6. The display device according to claim 1, wherein the metallic wiring includes:

a narrow wiring part having a width narrower than a UV excitable distance of the UV curing anisotropy conductive film; and a wide wiring part having a width wider than the UV excitable distance of the UV curing anisotropy conductive film, wherein the plurality of openings are not formed in the narrow wiring part, and the plurality of openings are formed in the wide wiring part.

7. The display device according to claim 1, wherein the at least one of the bumps is disposed between the two adjacent openings in a cross-sectional view taken along a longitudinal direction of the at least one of the bumps.

8. A display device comprising:

a display panel;

a metallic wiring formed in the display panel; and a semiconductor integrated circuit element connected to the display panel through a UV curing anisotropy conductive film, wherein the semiconductor integrated circuit element includes a plurality of bumps, the metallic wiring is electrically connected to the bumps through the UV curing anisotropy conductive film, the metallic wiring includes a plurality of openings, at least one of the bumps is disposed between two adjacent openings closest to each other in the plurality of openings, each of the bumps does not overlap with any opening among the plurality of openings in a plan view, the metallic wiring includes:

a narrow wiring part having a width narrower than a UV excitable distance of the UV curing anisotropy conductive film; and a wide wiring part having a width wider than the UV excitable distance of the UV curing anisotropy conductive film, the plurality of openings are not formed in the narrow wiring part, and the plurality of openings are formed in the wide wiring part.

* * * * *